United States Patent
Sekiya et al.

(10) Patent No.: US 11,398,809 B2
(45) Date of Patent: Jul. 26, 2022

(54) ELASTIC WAVE DEVICE

(71) Applicant: Murata Manufacturing Co., Ltd., Nagaokakyo (JP)

(72) Inventors: Daisuke Sekiya, Nagaokakyo (JP); Taku Kikuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 883 days.

(21) Appl. No.: 16/167,611

(22) Filed: Oct. 23, 2018

(65) Prior Publication Data

US 2019/0058453 A1 Feb. 21, 2019

Related U.S. Application Data

(63) Continuation of application No. PCT/JP2017/011757, filed on Mar. 23, 2017.

(30) Foreign Application Priority Data

Jun. 9, 2016 (JP) .............................. JP2016-115226

(51) Int. Cl.
*H03H 9/145* (2006.01)
*H03H 9/10* (2006.01)
(Continued)

(52) U.S. Cl.
CPC .......... *H03H 9/145* (2013.01); *H01L 41/0475* (2013.01); *H01L 41/0533* (2013.01);
(Continued)

(58) Field of Classification Search
CPC .......... H03H 9/145; H03H 9/25; H03H 9/058; H03H 9/02543; H03H 9/1071; H01L 41/0533; H01L 41/0474; H01L 41/0475
See application file for complete search history.

(56) References Cited

U.S. PATENT DOCUMENTS 9,647,196 B2 * 5/2017 Bauer ................... H01L 41/053
2005/0100720 A1 5/2005 Shirai et al.
(Continued)

FOREIGN PATENT DOCUMENTS

| CN | 1638272 A | 7/2005 |
|---|---|---|
| JP | 11-243278 A | 9/1999 |

(Continued)

OTHER PUBLICATIONS

Official Communication issued in International Patent Application No. PCT/JP2017/011757, dated Apr. 18, 2017.
(Continued)

*Primary Examiner* — J. San Martin
(74) *Attorney, Agent, or Firm* — Keating & Bennett, LLP

(57) ABSTRACT

An elastic wave device includes a piezoelectric substrate including first and second primary surfaces opposing one another, a via electrode extending through the piezoelectric substrate, and a wiring electrode on the first primary surface of the piezoelectric substrate. The via electrode is connected at one end to the wiring electrode, and the via electrode includes a locking section at the one end, on the wiring electrode side. The locking section extends on the first primary surface of the piezoelectric substrate.

20 Claims, 3 Drawing Sheets

(51) Int. Cl.
*H01L 41/047* (2006.01)
*H03H 9/25* (2006.01)
*H01L 41/053* (2006.01)
*H03H 9/02* (2006.01)
*H03H 9/05* (2006.01)

(52) U.S. Cl.
CPC ........ *H03H 9/02543* (2013.01); *H03H 9/058* (2013.01); *H03H 9/1071* (2013.01); *H03H 9/25* (2013.01)

(56) References Cited

U.S. PATENT DOCUMENTS

| | | |
|---|---|---|
| 2005/0146397 A1 | 7/2005 | Koga et al. |
| 2007/0232016 A1* | 10/2007 | Hayashi ............ H01L 27/11507 257/E21.664 |
| 2009/0320574 A1 | 12/2009 | Yamada et al. |
| 2014/0182920 A1* | 7/2014 | Yanagisawa ......... H05K 3/0035 174/266 |
| 2015/0091065 A1 | 4/2015 | Wei et al. |
| 2015/0123744 A1 | 5/2015 | Nishimura et al. |
| 2015/0162893 A1* | 6/2015 | Fukano ................ H03H 9/059 310/313 B |
| 2017/0179920 A1* | 6/2017 | Kawasaki ............ H03H 9/1092 |
| 2019/0019939 A1* | 1/2019 | Park ........................ H03H 9/64 |

FOREIGN PATENT DOCUMENTS

| | | |
|---|---|---|
| JP | 2008-252351 A | 10/2008 |
| JP | 2009-159195 A | 7/2009 |
| JP | 2011-155196 A | 8/2011 |
| JP | 2012-005033 A | 1/2012 |
| JP | 2014-127623 A | 7/2014 |
| JP | 2015-091065 A | 5/2015 |

OTHER PUBLICATIONS

Official Communication issued in corresponding Chinese Patent Application No. 201780035673.2, dated Dec. 3, 2021.

\* cited by examiner

ELASTIC WAVE DEVICE

CROSS REFERENCE TO RELATED APPLICATIONS

This application claims the benefit of priority to Japanese Patent Application No. 2016-115226 filed on Jun. 9, 2016 and is a Continuation Application of PCT Application No. PCT/JP2017/011757 filed on Mar. 23, 2017. The entire contents of each application are hereby incorporated herein by reference.

BACKGROUND OF THE INVENTION

1. Field of the Invention

The present invention relates to an elastic wave device.

2. Description of the Related Art

Elastic wave devices have been used in, for example, filters in cellular phones. For example, the elastic wave device described in Japanese Unexamined Patent Application Publication No. 2008-252351, below, includes a piezoelectric substrate having a through hole. An element wiring covers this through hole on the piezoelectric substrate. The element wiring has a depression that joins the through hole. In the through hole and depression is a via electrode.

When the temperature changes during the fabrication of an elastic wave device or use of an elastic wave device, thermal expansion occurs in the components of the elastic wave device, the circuit board on which the elastic wave device is mounted, and the resin with which the elastic wave device is sealed. Since these elements have different thermal expansion coefficients, the magnitude of thermal expansion also varies from element to element. As a result, a force that removes the via electrode from the piezoelectric substrate acts on the elastic wave device. When this happens to the elastic wave device described in Japanese Unexamined Patent Application Publication No. 2008-252351, the via electrode comes off the piezoelectric substrate easily. Since the via electrode is bonded to the side of the through hole simply, for example, by vapor deposition or sputtering, the strength of bonding between the via electrode and through hole is weak.

SUMMARY OF THE INVENTION

Preferred embodiments of the present invention provide elastic wave devices in each of which a via electrode does not come off a piezoelectric body easily.

An elastic wave device according to a preferred embodiment of the present invention includes a piezoelectric body including opposing first and second primary surfaces, a via electrode extending through the piezoelectric body, and a wiring electrode disposed on the first primary surface of the piezoelectric body. The via electrode is connected at one end to the wiring electrode, and the via electrode includes a locking section at the one end, on the wiring electrode side. The locking section extends on the first primary surface of the piezoelectric body.

In a particular aspect of an elastic wave device according to a preferred embodiment of the present invention, the piezoelectric body includes a through hole, the via electrode includes a through section as a portion positioned inside the through hole, and the locking section of the via electrode has a cross-sectional area larger than the cross-sectional area of the through section at the end on the first primary surface side. This makes the via electrode even less likely to come off the piezoelectric body.

In another particular aspect of an elastic wave device according to a preferred embodiment of the present invention, the surface of the locking section in contact with the wiring electrode is a rough surface. This further increases the area of contact between the via electrode and wiring electrode, making the electrical resistance even lower.

In another particular aspect of an elastic wave device according to a preferred embodiment of the present invention, the wiring electrode is a multilayer body, including a plurality of layers, and includes a hard-to-etch layer, which is a layer more resistant to wet etching than the outermost layer on the piezoelectric substrate side of the wiring electrode. This enables, during the fabrication of the elastic wave device, the outermost layer on the piezoelectric substrate side to be side-etched to a greater extent, giving the locking section, created in a hollow, of the via electrode an even larger cross-sectional area in the portion where it touches the first primary surface of the piezoelectric substrate. As a result, the via electrode becomes even less likely to come off the piezoelectric substrate.

In yet another particular aspect of an elastic wave device according to a preferred embodiment of the present invention, there is at least one excitation electrode on the first primary surface of the piezoelectric substrate.

In a further particular aspect of an elastic wave device according to a preferred embodiment of the present invention, the piezoelectric substrate with the wiring electrode thereon is a lid, and the device further includes an extra piezoelectric substrate positioned opposite to the lid and provided with at least one excitation electrode.

In a yet further particular aspect of an elastic wave device according to a preferred embodiment of the present invention, the at least one electrode includes interdigital transducer electrodes.

According to preferred embodiments of the present invention, elastic wave devices are provided in each of which a via electrode does not easily come off a piezoelectric body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes specific preferred embodiments of the present invention with reference to the drawings.

It is to be noted that the preferred embodiments described herein are illustrative and partial replacement or combination of the configurations between different preferred embodiments is possible.

Figure 1:
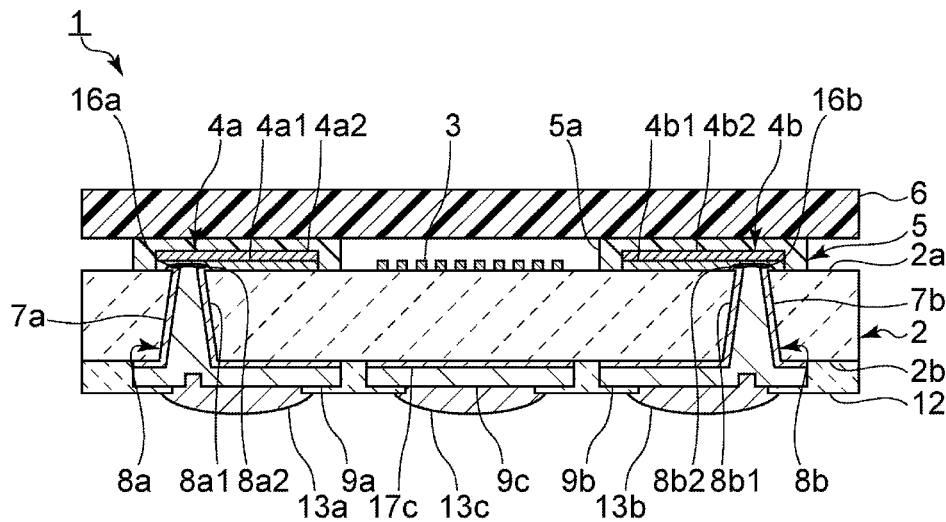
FIG. 1 is a front cross-section of an elastic wave device according to Preferred Embodiment 1 of the present invention.

FIG. 1 is a front cross-section of an elastic wave device according to Preferred Embodiment 1 of the present invention.

The elastic wave device 1 includes a piezoelectric substrate 2 as the piezoelectric body. The piezoelectric substrate 2 includes a primary surface 2a and a primary surface 2b as the opposing first and second primary surfaces. The piezoelectric substrate 2 is made of lithium tantalate. It should be noted that the piezoelectric substrate 2 may be made of piezoelectric materials such as, for example, lithium niobate, potassium niobate, quartz, langasite, ZnO, PZT, and lithium tetraborate. The piezoelectric body of the elastic wave device 1 may alternatively be a piezoelectric thin film.

On the primary surface 2a of the piezoelectric substrate 2 is at least one interdigital transducer (IDT) electrode 3 as the at least one excitation electrode. Applying alternating voltage to the IDT electrode 3 excites elastic waves. Materials that can be used for the IDT electrode 3 include, for example, metals such as Al, Pt, Cu, Au, Ti, Ni, Cr, W, Ag, Pd, Co, and Mn and alloys containing at least one of the metals. The IDT electrodes 3 may be single-layer or may alternatively be multilayer bodies including multiple metal layers.

On the piezoelectric substrate 2 are wiring electrodes 4a and 4b. In this preferred embodiment, the wiring electrodes 4a and 4b are electrically coupled to the IDT electrodes 3. The wiring electrode 4a includes first and second electrode layers 4a1 and 4a2. The wiring electrode 4b, too, includes first and second electrode layers 4b1 and 4b2. The first electrode layers 4a1 and 4b1 are closer to the piezoelectric substrate 2 than the second electrode layers 4a2 and 4b2 are.

Materials that can be used for the wiring electrodes 4a and 4b include, for example, metals such as Al, Pt, Cu, Au, Ti, Ni, Cr, W, Ag, Pd, Co, and Mn and alloys containing at least one of them. The wiring electrodes 4a and 4b may be single-layer or may alternatively be multilayer bodies including multiple metal layers.

The wiring electrodes 4a and 4b and IDT electrodes 3 can be formed by, for example, sputtering or vapor deposition.

On the primary surface 2a of the piezoelectric substrate 2 is a support 5 including a cavity 5a. The support 5 covers at least a portion of the wiring electrodes 4a and 4b. The IDT electrodes 3 are inside the cavity 5a, with the IDT electrodes 3 surrounded by the support 5. The support 5 is made of, for example, an appropriate resin. The support 5 can be formed by, for example, photolithography.

On the support 5, a cover 6 closes the cavity 5a. This creates an empty space surrounded by the piezoelectric substrate 2, support 5, and cover 6.

Figure 2:
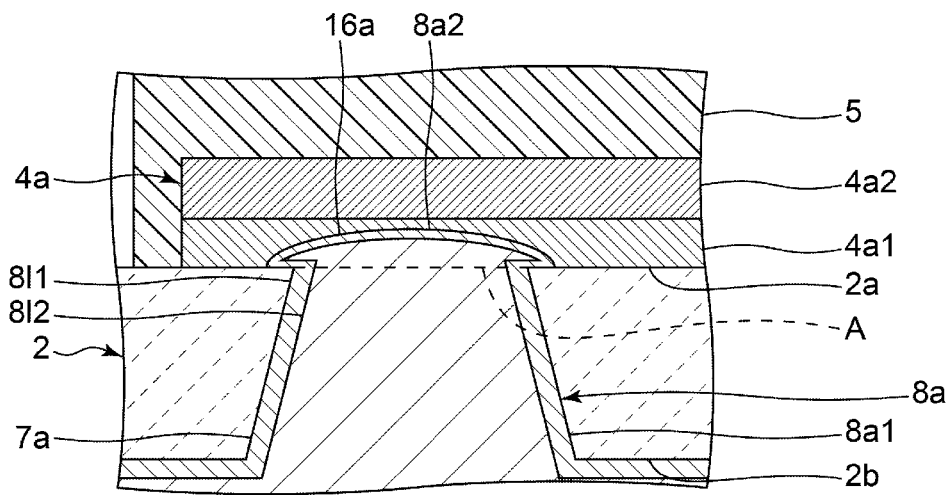
FIG. 2 is an enlarged view of a via electrode and its surroundings in FIG. 1.

The elastic wave device 1 includes a via electrode 8a extending through the piezoelectric layer 2 and connected to the wiring electrode 4a. As illustrated in FIG. 2, an enlarged view of FIG. 1, the piezoelectric substrate 2 includes a through hole 7a, which is a hole extending through the piezoelectric substrate 2. The wiring electrode 4a includes a hollow 16a that joins the through hole 7a and reaches the primary surface 2a of the piezoelectric substrate 2.

The via electrode 8a includes a through section 8a1, a portion positioned inside the though hole 7a. The broken line A in FIG. 2 indicates the end of the through section 8a1 on the side of the primary surface 2a of the piezoelectric substrate 2. The via electrode 8a includes a locking section 8a2 positioned inside the hollow 16a and connected to the wiring electrode 4a. The through section 8a1 is a portion in which the metal for the via electrode 8a fills the through hole 7a, and the locking section 8a2 is a portion in which the same metal fills the hollow 16a.

In this preferred embodiment, the hollow 16a is located in the first electrode layer 4a1 and does not reach the second electrode layer 4a2. It is to be understood that the hollow 16a may reach the second electrode layer 4a2, and the locking section 8a2 may reach the second electrode layer 4a2. The locking section 8a2 extends on the primary surface 2a.

Figure 3:
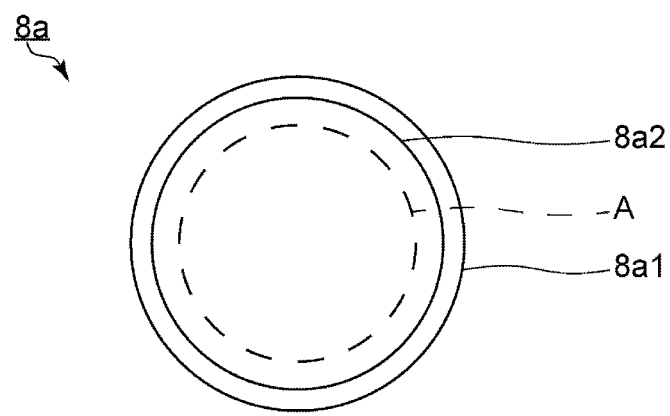
FIG. 3 is a plan view of a via electrode in Preferred Embodiment 1 of the present invention.

As illustrated in FIG. 3, a plan view of the via electrode 8a, the shape of the via electrode 8a in plan view is not critical, but in this preferred embodiment, it is round. As illustrated in FIGS. 2 and 3, the cross-sectional area of the locking section 8a2 in the portion touching the primary surface 2a (FIG. 3: area of a portion surrounded by the circumference of the locking section 8a2) is larger than that of the through section 8a1 at the end on the primary surface 2a side (FIG. 3: area of a portion surrounded by the circumference of the broken line A).

In this preferred embodiment, the via electrode 8a includes an outer layer 811 touching the through hole 7a and an inner layer 812 under the outer layer 811. The inner layer 812 reaches the hollow 16a from the through hole 7a. It is to be noted that the via electrode 8a may be a single layer.

Referring back to FIG. 1, like the via electrode 8a, the via electrode 8b also includes a through section 8b1, a portion positioned inside a through hole 7b created through the piezoelectric substrate 2. The via electrode 8b includes a locking section 8b2 that is positioned inside a hollow 16b created in the wiring electrode 4b and is connected to the wiring electrode 4b. It is enough that at least one via electrode in the elastic wave device 1 has the configuration of the via electrode 8a.

This preferred embodiment is preferably structured such that the via electrode 8a is connected at one end to the wiring electrode 4a and that the via electrode 8a includes, at this end on the wiring electrode 4a side, a locking section 8a2 that extends on the primary surface 2a of the piezoelectric substrate 2. This prevents the via electrode 8a from coming off the piezoelectric substrate 2 easily.

It is to be noted that for the locking section 8a2, it is preferred that the portion of the locking section 8a2 touching the primary surface 2a have a cross-sectional area larger than that of the through section 8a1 at the end on the primary surface 2a side. This makes the via electrode 8a even less likely to come off the piezoelectric substrate 2. Moreover, the area of contact between the locking section 8a2 and wiring electrode 4a is increased, resulting in to a lower electrical resistance.

The following describes the formation of the through holes 7a and 7b, hollows 16a and 16b, and via electrodes 8a and 8b.

To create the through holes 7a and 7b in the piezoelectric substrate 2, techniques such as laser beam machining, blasting, and ultrasonic machining can be used. One of these machining techniques may be used alone, or alternatively two or more of these machining techniques may be combined.

Then, the wiring electrodes 4a and 4b are wet-etched from the through holes 7a and 7b to create the hollows 16a and 16b in the wiring electrodes 4a and 4b. This involves side etching of the wiring electrodes 4a and 4b from the through holes 7a and 7b, which makes the hollows 16a and 16b reach the primary surface 2a of the piezoelectric substrate 2.

Then, a powering layer is formed on the inner surface of the through holes 7a and 7b and hollows 16a and 16b, for example by sputtering or vapor deposition, from the primary surface 2b side of the piezoelectric substrate 2. This powering layer is the aforementioned outer layer of the via electrodes 8a and 8b.

Then, using the powering layer, the aforementioned inner layer of the via electrodes 8a and 8b is formed by Cu electrolytic plating. The electrolytic plating may be performed using a metal other than Cu, for example, Ni. It is also possible to perform electrolytic plating without the powering layer and using the wiring electrodes 4a and 4b instead. As can be seen from this, the via electrodes 8a and 8b may each be a single layer.

The cavity 16a reaching the primary surface 2a allows the via electrode 8a to come into contact with the primary surface 2a. As a result, the cross-sectional area of the portion of the locking section 8a2 touching the primary surface 2a, illustrated in FIGS. 2 and 3, is larger than that of the through section 8a1 at the end on the primary surface 2a side, providing a way to prevent the via electrode 8a from coming off the piezoelectric substrate 2 easily.

As illustrated in FIG. 1, there is wirings 9a to 9c on the primary surface 2b of the piezoelectric substrate 2. The pieces of wiring 9a and 9b are connected to the end of the via electrodes 8a and 8b, respectively, on the side of the primary surface 2b of the piezoelectric substrate 2. The pieces of wiring 9a and 9b are electrically coupled to the IDT electrodes 3 by the intermediation of the via electrodes 8a and 8b and wiring electrodes 4a and 4b, respectively. On the other hand, the wiring 9c is not electrically coupled to the IDT electrodes 3.

In the fabrication of an elastic wave device of this preferred embodiment, the aforementioned powering layer is formed on the primary surface 2b of the piezoelectric substrate 2, too, continuously from the through holes 7a and 7b. This at the same time forms a powering layer 17c on the primary surface 2b. With the formation of the via electrodes 8a and 8b, the wirings 9a to 9c are formed by Cu electrolytic plating.

It should be noted that the wirings 9a to 9c may be made of, for example, a metal different from that for the via electrodes 8a and 8b or conductive paste. The wirings 9a to 9c may be formed by, for example, sputtering or vapor deposition. When conductive paste is used for the wirings 9a to 9c, the wirings 9a to 9c can be formed by, for example, printing.

On the primary surface 2b, a protective film 12 covers a portion of the wirings 9a to 9c. The protective film 12 may be, by way example, an organic film, for example, made from epoxy resin, polyimide resin, or acrylic resin, or may alternatively be an inorganic film, for example made from SOG. An organic protective film 12 can be produced by, for example, printing. An inorganic protective film 12 can be produced by, for example, sputtering or deposition. It is to be noted that the protective film 12 is optional.

To the exposed portions of wirings 9a to 9c, not covered by the protective film 12, bumps 13a to 13c are bonded. The bumps 13a to 13c are made of, for example, solder. The bumps 13a to 13c can be formed by, for example, printing or ball mounting.

The elastic wave device 1 is mounted, for example, onto a circuit board, with the bumps 13a to 13c interposed. The bumps 13a and 13b, wirings 9a and 9b, via electrodes 8a and 8b, and wiring electrodes 4a and 4b connect the IDT electrodes 3 to the outside.

In this preferred embodiment, the wiring 9c is not electrically coupled to the IDT electrodes 3. At least a portion of the wiring 9c overlaps the IDT electrodes 3 in plan view. The bump 13c may be bonded to, for example, the ground wiring of the circuit board. This improves heat dissipation. It should be understood that the bump 13c and wiring 9c are optional.

In the elastic wave device 1, the piezoelectric substrate 2 preferably is about 70 μm thick, and the support 5 preferably is about 10 μm thick in the direction parallel to the thickness of the piezoelectric substrate 2, for example. The wirings 9a to 9c are each preferably between about 10 μm and about 15 μm thick, the protective film 12 is preferably between about 20 μm and about 30 μm thick, and the bumps 13a to 13c are each preferably about 35 μm thick in the direction parallel to the thickness of the piezoelectric substrate 2, for example. It should be noted that these are not the only values possible for the thickness of each element.

As illustrated in FIG. 1, in this preferred embodiment, the side of the through sections 8a1 and 8b1 of the via electrodes 8a and 8b slopes so that the diameter of the through sections 8a1 and 8b1 narrows with smaller distance from the primary surface 2a of the piezoelectric substrate 2. The locking sections 8a2 and 8b2 are on the side of the narrower end of the through sections 8a1 and 8b1. Even when force pulls the via electrodes 8a and 8b toward the primary surface 2a side, this sloping side prevents the via electrodes 8a and 8b from coming off the piezoelectric substrate 2 easily. When force pulls the via electrodes 8a and 8b in the direction opposite to the primary surface 2a side, too, the via electrodes 8a and 8b do not come off the piezoelectric substrate 2 easily, as described above.

In this way, the detachment of the via electrodes 8a and 8b from the piezoelectric substrate 2 is prevented effectively. It should be noted that the sloping side of the through sections 8a1 and 8b1 is optional.

Figure 4:
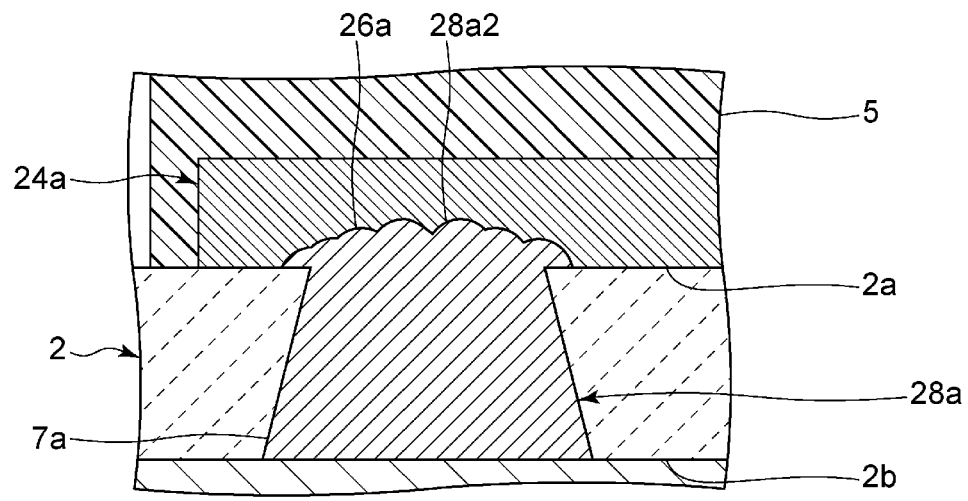
FIG. 4 is a front cross-section of an elastic wave device according to Preferred Embodiment 2 of the present invention, enlarged to illustrate a via electrode and its surroundings.

FIG. 4 is a front cross-section of an elastic wave device according to Preferred Embodiment 2, enlarged to illustrate a via electrode and its surroundings.

In this preferred embodiment, differences from Preferred Embodiment 1 are that the locking section 28a2 of the via electrode 28a touches the wiring electrode 24a with a rough surface, and that the wiring electrode 24a has a different configuration. Moreover, the via electrode 28a is single-layer unlike Preferred Embodiment 1. For the rest, the elastic wave device according to this preferred embodiment preferably has the same or substantially the same configuration as the elastic wave device 1 of Preferred Embodiment 1.

The wiring electrode 24a is a single-layer electrode made from alloy, such as AlCu. As in the foregoing, a hollow 26a is created by wet-etching the wiring electrode 24a. Since the wiring electrode 24a is made from alloy, the wiring electrode 24a is relatively susceptible to wet etching in some portions and resistant in others. The resulting hollow 26a therefore has a rough surface. As a result, the locking section 28a2 of the via electrode 28a, provided in the hollow 26a, touches the wiring electrode 24a with a rough surface.

This rough surface of the locking section 28a2 further increases the area of contact between the via electrode 28a and wiring electrode 24a, making the electrical resistance even lower. Moreover, as in Preferred Embodiment 1, the via electrode 28a does not come off the piezoelectric substrate 2 easily.

It is to be understood that the wiring electrode 24a may include multiple electrode layers including one made from alloy. In that case, it is preferred that the electrode layer made from alloy be proximate to the piezoelectric substrate 2. This is suitable for making the surface of the hollow 26a rough and for ensuring that the locking section 28a2 touches the wiring electrode 24a with a rough surface.

Figure 5:
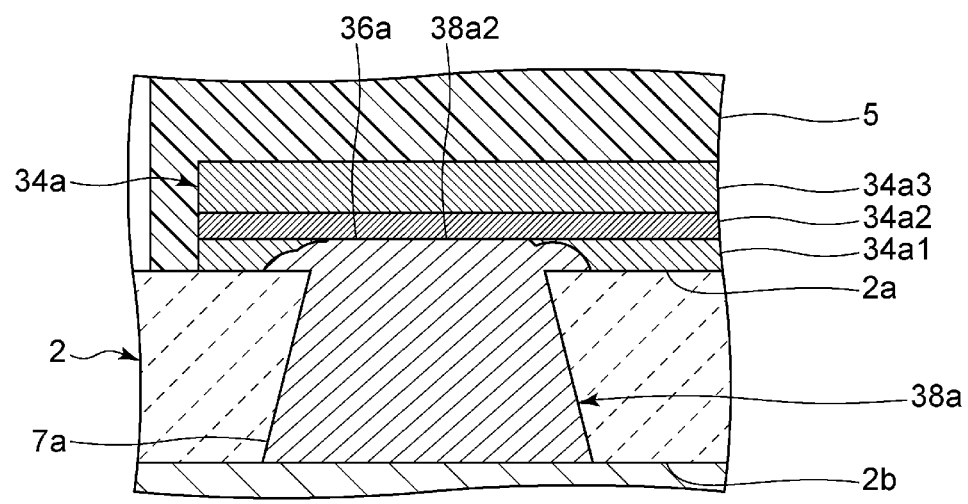
FIG. 5 is a front cross-section of an elastic wave device according to Preferred Embodiment 3 of the present invention, enlarged to illustrate a via electrode and its surroundings.

FIG. 5 is a front cross-section of an elastic wave device according to Preferred Embodiment 3, enlarged to illustrate a via electrode and its surroundings.

In the elastic wave device of this preferred embodiment, a difference from Preferred Embodiment 2 is that the wiring electrode 34a includes a hard-to-etch layer, which is a layer relatively resistant to wet etching. Moreover, the cross-sectional area of the locking section 38a2 of the via electrode 38a in the portion touching the primary surface 2a of the piezoelectric substrate 2 is different from that in Preferred Embodiment 2. For the rest, the elastic wave device according to this preferred embodiment has the same configuration as the elastic wave device according to Preferred Embodiment 2.

The wiring electrode 34a includes first to third electrode layers 34a1 to 34a3. The first electrode layer 34a1 is proximate to the piezoelectric substrate 2 within the wiring electrode 34a. On the first electrode layer 34a1 is the second electrode layer 34a2, and on the second electrode layer 34a2 is the third electrode layer 34a3.

The first electrode layer 34a1 is a layer of an appropriate alloy. The second electrode layer 34a2 is the aforementioned hard-to-etch layer. The second electrode layer 34a2 is more resistant than the first electrode layer 34a1 to wet etching with the etchant used during the fabrication of the elastic wave device 1 of this preferred embodiment. Examples of such etchants include a mixture of potassium hydrogen and hydrogen peroxide as well as potassium hydrogen sulfate. The second electrode layer 34a2 is made from, for example, Pt or Au. The third electrode layer 34a3 is made from an appropriate alloy.

As in Preferred Embodiment 2, a hollow 36a is created by wet-etching the first electrode layer 34a1. The first electrode layer 34a1 is wet-etched until a portion of the hollow 36a reaches the second electrode layer 34a2. Since the second electrode layer 34a2 is more resistant to wet etching than the first electrode layer 34a1, the first electrode layer 34a1 is side-etched to a greater extent. This gives the locking section 38a2, created in the hollow 36a, of the via electrode 38a an even larger cross-sectional area in the portion touching the primary surface 2a of the piezoelectric substrate 2.

Furthermore, since the second electrode layer 34a2 is resistant to wet etching, it is unlikely that the wiring electrode 34a loses its thickness. The decrease in the strength of the wiring electrode 34a is therefore limited, and the via electrode 38a is even more stable with respect to detachment from the piezoelectric substrate 2.

Figure 6:
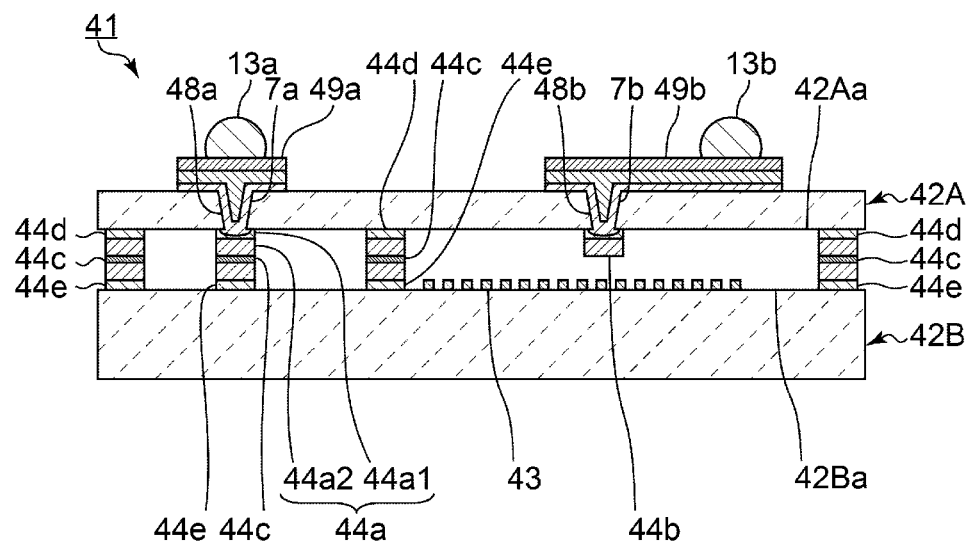
FIG. 6 is a front cross-section of an elastic wave device according to Preferred Embodiment 4 of the present invention.

FIG. 6 is a front cross-section of an elastic wave device according to Preferred Embodiment 4.

The elastic wave device 41 includes first and second piezoelectric substrates 42A and 42B. The first piezoelectric substrate 42A is the piezoelectric substrate including via electrodes 48a and 48b. In this preferred embodiment, the first piezoelectric substrate 42A is a lid of the elastic wave device 41.

On the second piezoelectric substrate 42B, different from the first piezoelectric substrate 42A, are IDT electrodes 43. The second piezoelectric substrate 42B is opposite to the first piezoelectric layer 42A.

On the primary surface 42Aa of the first piezoelectric substrate 42A, which is on the second piezoelectric substrate 42B side, a via electrode 48a is connected to a wiring electrode 44a as in Preferred Embodiment 1. The wiring electrode 44a includes first and second electrode layers 44a1 and 44a2. The first electrode layer 44a1 is made from Ti, and the second electrode layer 44a2 is made from Cu.

On the primary surface 42Aa of the first piezoelectric substrate 42A, a wiring electrode 44b is connected to a via electrode 48b and includes first and second electrode layers likewise. There are also multiple wiring electrodes 44d on the primary surface 42Aa, having first and second electrodes like the wiring electrodes 44a and 44b. On the primary surface 42Ba of the second piezoelectric substrate 42B, which is on the first piezoelectric substrate 42A side, too, there are multiple wiring electrodes 44e including first and second electrode layers. The wiring electrodes 44b, 44d, and 44e are made from materials similar to those for the wiring electrode 44a. It should be noted that these are not the only materials that can be used for the wiring electrodes 44a, 44b, 44d, and 44e. Each of the wiring electrodes 44a, 44b, 44d, and 44e may be made from a different material.

The multiple wiring electrodes 44e overlap the wiring electrode 44a and the multiple wiring electrodes 44d in plan view. A conductive adhesive 44c bonds the second electrode layer 44a2 of the wiring electrode 44a and the second electrode layer of the wiring electrode 44e together. Likewise, conductive adhesives 44c bond the second electrode layer of the multiple wiring electrodes 44d and that of the multiple wiring electrodes 44e together. The conductive adhesive 44c can be of any type, but in this preferred embodiment, it is an electrode layer made from Sn. In this way, a wiring electrode 44a and multiple wiring electrodes 44d are electrically coupled to multiple wiring electrodes 44e.

The wiring electrode 44b is opposite to the IDT electrodes 43 and, in the cross-section illustrated in FIG. 6, is not connected to a wiring electrode on the second piezoelectric substrate 42B. It is to be understood that the wiring electrode 44b may be connected to a wiring electrode on the second piezoelectric substrate 42B somewhere other than the cross-section illustrated in FIG. 6.

Figure 7:
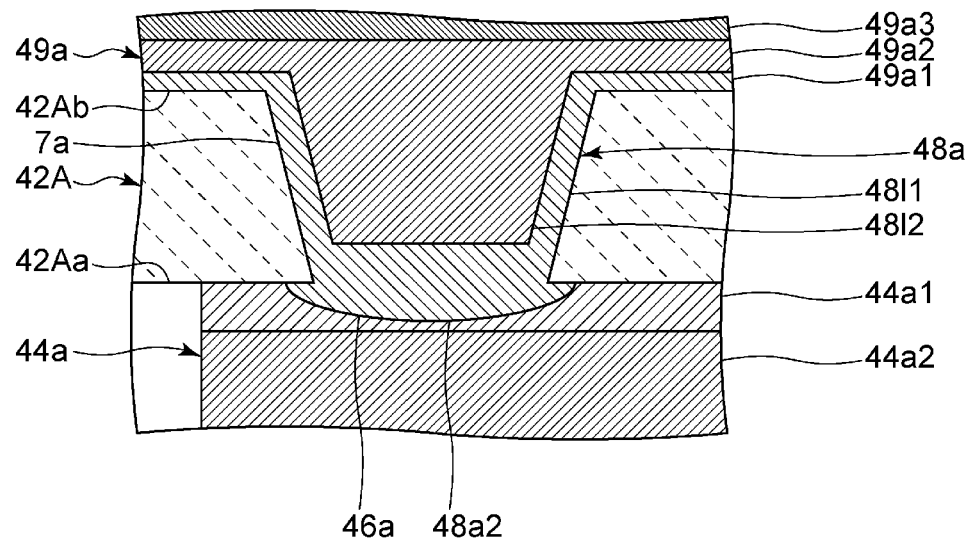
FIG. 7 is an enlarged view of a via electrode and its surrounding surroundings in FIG. 6.

As illustrated in FIG. 7, an enlarged view of FIG. 6, the via electrode 48a includes an outer layer 4811 touching the through hole 7a and an inner layer 4812 under the outer layer 4811. In this preferred embodiment, the inner layer 4812 does not reach the hollow 46a and is inside the through hole 7a. The portion of the outer layer 4811 inside the hollow 46a is a locking section 48a2 similar to that in Preferred Embodiment 1.

On the primary surface 42Ab, on the side opposite to the primary surface 42Aa, of the first piezoelectric substrate 42A, wiring 49a is connected to the via electrode 48a. The wiring 49a includes first to third layers 49a1 to 49a3. As in this preferred embodiment, the first layer 49a1 and the outer layer 4811 of the via electrode 48a may be integral with each other. The second layer 49a2 and the inner layer 4812 of the via electrode 48a may be integral with each other. This improves productivity and, furthermore, reduces the contact resistance between the via electrode 48a and wiring 49a.

On the second layer 49a2 is a third layer 49a3. On the third layer 49a3 is the bump 13a illustrated in FIG. 6. In this preferred embodiment, the first layer 49a1 and the outer layer 4811 of the via electrode 48a are made of Ti. The second layer 49a2 and the inner layer 4812 of the via electrode 48a are made of Cu. The third layer 49a3 is made of Ni.

It should be understood that these are not the only materials that can be used for the first to third layers 49a1 to 49a3, outer layer 4811, and inner layer 4812. The via electrode 48a may be a single layer. The integral formation of the via electrode 48a and wiring 49a is optional.

The via electrode 48b and wiring 49b in FIG. 6 are preferably structured in the same way as the via electrode 48a and wiring 49a. There is a bump 13b on the surface of the wiring 49b on the side opposite to the first piezoelectric substrate 42A.

In this preferred embodiment, too, the via electrodes 48a and 48b do not come off the first piezoelectric substrate 42A easily, as in Preferred Embodiment 1.

Although in Preferred Embodiments 1 to 4, the excitation electrode preferably includes IDT electrodes, the excitation electrode may be an electrode(s) that is not defined by IDT electrodes.

Preferred embodiments of the present invention can also be suitably applied to, for example, boundary acoustic wave devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric body including opposing first and second primary surfaces;
a via electrode extending through the piezoelectric body; and
a wiring electrode disposed on the first primary surface of the piezoelectric body; wherein
the via electrode is connected at one end to the wiring electrode;
the via electrode includes a locking section at the one end, on a wiring electrode side, the locking section extending on the first primary surface of the piezoelectric body;
the wiring electrode is a multilayer body including a plurality of layers; and
the plurality of layers include a layer more resistant to wet etching than an outermost layer of the plurality of layers on a piezoelectric body side of the wiring electrode.

2. The elastic wave device according to claim 1, wherein the piezoelectric body includes a through hole;
the via electrode includes a through section as a portion positioned inside the through hole; and
the locking section of the via electrode has a cross-sectional area larger than a cross-sectional area of the through section at an end on the first primary surface side.

3. The elastic wave device according to claim 1, wherein a surface of the locking section in contact with the wiring electrode is a roughened surface.

4. The elastic wave device according to claim 1, wherein at least one excitation electrode is provided on the first primary surface of the piezoelectric body.

5. The elastic wave device according to claim 1, wherein the piezoelectric body with the wiring electrode thereon is a lid, and the elastic wave device further includes an extra piezoelectric body positioned opposite to the lid and provided with at least one excitation electrode.

6. The elastic wave device according to claim 4, wherein the at least one excitation electrode includes at least one interdigital transducer electrode.

7. The elastic wave device according to claim 1, wherein the piezoelectric body is a piezoelectric substrate made of one of lithium tantalate, lithium niobate, potassium niobate, quartz, langasite, ZnO, PZT, and lithium tetraborate.

8. The elastic wave device according to claim 6, wherein the at least one IDT electrode is a single layer or a multilayer body.

9. The elastic wave device according to claim 1, further comprising a support on the first primary surface of the piezoelectric body.

10. The elastic wave device according to claim 9, wherein the support covers at least a portion of the wiring electrode.

11. The elastic wave device according to claim 9, wherein the support includes a cavity.

12. The elastic wave device according to claim 11, further comprising at least one interdigital transducer electrode in the cavity.

13. The elastic wave device according to claim 9, wherein the support is made of resin.

14. The elastic wave device according to claim 11, further comprising a cover that closes the cavity.

15. The elastic wave device according to claim 1, wherein the wiring electrode includes a hollow portion that extends to the first primary surface of the piezoelectric body.

16. The elastic wave device according to claim 1, wherein the piezoelectric body includes a through hole, and the wiring electrode includes a hollow that joins the through hole.

17. The elastic wave device according to claim 2, wherein the through section is a portion in which metal of the via electrode fills the through hole.

18. The elastic wave device according to claim 16, wherein the locking section is a portion in which a metal fills the hollow.

19. The elastic wave device according to claim 16, wherein the wiring electrode includes two electrode layers, and the hollow extends to at least one of the two electrode layers.

20. An elastic wave device comprising:
a piezoelectric body including opposing first and second primary surfaces;
a via electrode extending through the piezoelectric body; and
a wiring electrode disposed on the first primary surface of the piezoelectric body; wherein
the via electrode is connected at one end to the wiring electrode;
the via electrode includes a locking section at the one end, on a wiring electrode side, the locking section extending on the first primary surface of the piezoelectric body;
the wiring electrode is a multilayer body including a plurality of layers; and
the plurality of layers include a layer made from Pt or Au that is more resistant to wet etching than an outermost layer of the plurality of layers on a piezoelectric body side of the wiring electrode.

* * * * *